United States Patent
Ayyapureddi et al.

(10) Patent No.: US 11,211,110 B1
(45) Date of Patent: Dec. 28, 2021

(54) APPARATUSES, SYSTEMS, AND METHODS FOR ADDRESS SCRAMBLING IN A VOLATILE MEMORY DEVICE

(71) Applicant: Micron Technology, Inc., Boise, ID (US)

(72) Inventors: Sujeet Ayyapureddi, Boise, ID (US); Donald M. Morgan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/005,275

(22) Filed: Aug. 27, 2020

(51) Int. Cl.
| | |
|---|---|
| *G11C 11/40* | (2006.01) |
| *G11C 11/406* | (2006.01) |
| *G06F 7/58* | (2006.01) |
| *G11C 11/4072* | (2006.01) |
| *G11C 11/408* | (2006.01) |

(52) U.S. Cl.
CPC ........ *G11C 11/40611* (2013.01); *G06F 7/588* (2013.01); *G11C 11/4072* (2013.01); *G11C 11/4087* (2013.01); *G11C 11/40618* (2013.01)

(58) Field of Classification Search
CPC ........... G11C 11/40611; G11C 11/4087; G11C 11/40618; G11C 11/4072; G06F 7/588
See application file for complete search history.

(56) References Cited

U.S. PATENT DOCUMENTS

| | | | | |
|---|---|---|---|---|
| 5,943,283 | A * | 8/1999 | Wong | G06F 21/79 365/230.01 |
| 2013/0094320 | A1* | 4/2013 | Yoo | G06F 12/02 365/230.06 |
| 2019/0215168 | A1* | 7/2019 | Wu | H04L 9/0894 |

* cited by examiner

*Primary Examiner* — Ajay Ojha
(74) *Attorney, Agent, or Firm* — Dorsey & Whitney LLP

(57) ABSTRACT

A volatile memories includes an address scrambler configured to scramble at least a portion of a received addresses to obscure address topography of a memory array using at least one scramble key. The at least one scramble key is generated by a random number generator. The address scrambler is configured to perform logical bitwise operations using between a received address and the at least one scramble key to generate the scrambled row address.

28 Claims, 5 Drawing Sheets

APPARATUSES, SYSTEMS, AND METHODS FOR ADDRESS SCRAMBLING IN A VOLATILE MEMORY DEVICE

BACKGROUND

This disclosure relates generally to volatile memory devices, such as dynamic random access memory (DRAM). Attacks on volatile memories have become increasingly prevalent, including row hammer attacks and other types of attacks. Some attacks on memory devices are based on knowledge of an address topology of the memory array of the memory device. Thus, attackers may go to some length to reverse engineer an address topology of a DRAM device in order to coordinate attacks on the memory array. Increased security to obscure address topology in a memory device is desired

DETAILED DESCRIPTION

Figure 1:
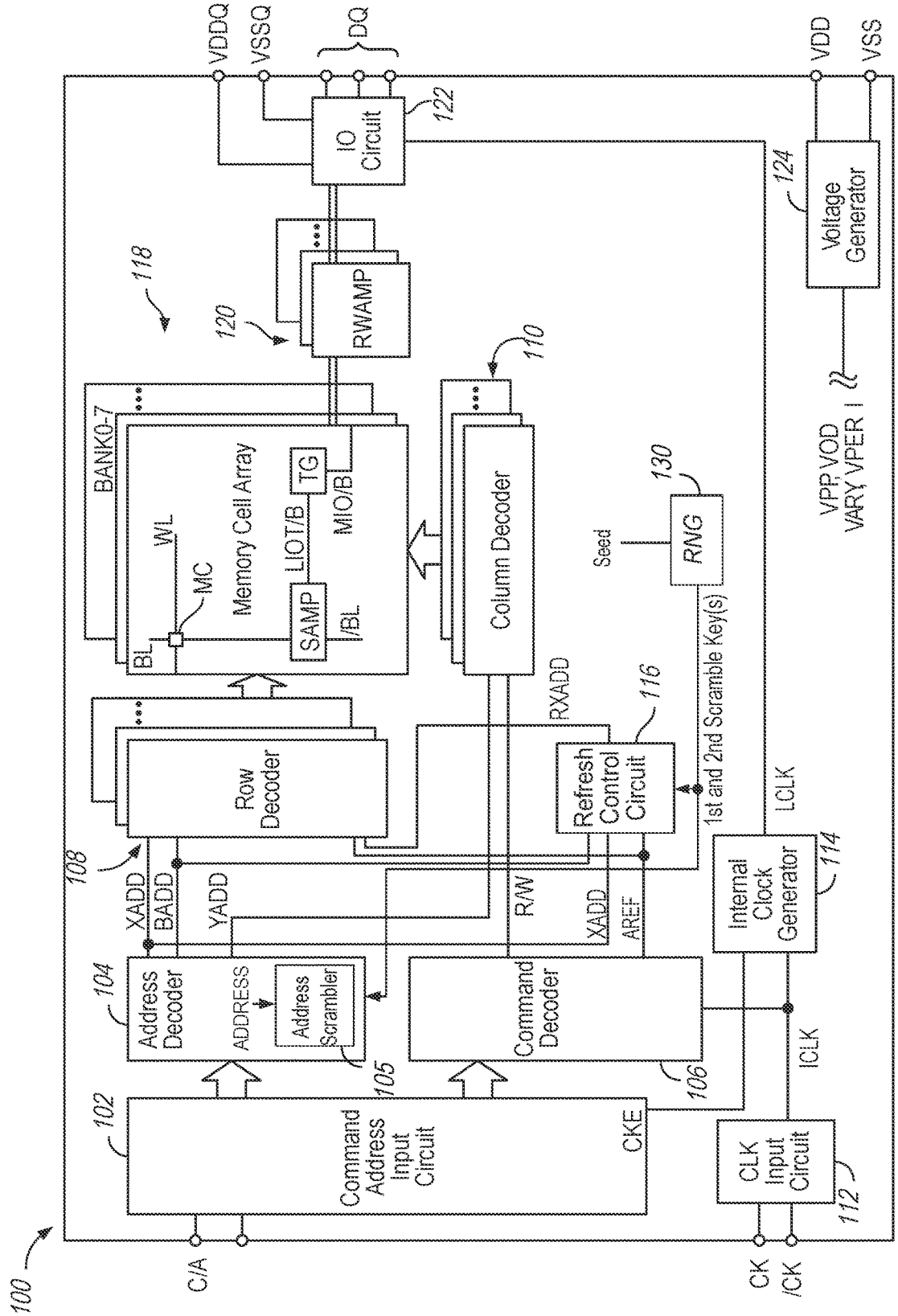
FIG. 1 is a block diagram of a semiconductor device according an embodiment of the disclosure.

This application describes examples of address scrambling techniques in volatile memories to obscure address topography of a memory array. In some embodiments, an address decoder of a memory may include an address scrambler configured to scramble at least a portion of a received address (e.g., from a memory controller via a command and address bus) based on one or more scramble key(s) to provide a scrambled address. In some examples, the row address is scrambled. The scramble key(s) may be generated by a random number generator of the memory. The address scrambler may be configured to perform logical bitwise operations using the received address and the scramble key(s) to generate the scrambled row address. The random number generator may randomly generate the first scramble key(s) using random number generator logic or circuitry. The random number generator may include a linear feedback shift register and may use a seed value to initiate the random generation of the keys. In some examples, the random number generator 130 may generate different scramble key(s) for each bank of the memory array. The scrambled row address XADD may improve security of the memory by making it more difficult to decipher an address topography of a memory array in order to attack the memory to retrieve sensitive data.

In some embodiments, the memory may further include a second address scrambler to scramble sequential refresh addresses during auto-refresh operations. That is, rather than refreshing addresses of the memory array in sequence, the memory may scramble the sequential automatic refresh addresses based on a second (one or more) scramble key(s) provided by the random number generator to provide a scrambled automatic refresh address. The second address scrambler may be configured to perform logical bitwise operations using the sequential automatic refresh address and the second scramble key(s) to generate the scrambled refresh address during auto-refresh operations. The random number generator may randomly generate the second scramble key(s) using random number generator logic or circuitry. In some examples, the random number generator may generate different first and second scramble keys for generation of the scrambled row address by the first scrambler and the scrambled refresh address by the second scrambler during an auto-refresh operation. The scrambled refresh address may provide an added layer of security by making it even more difficult to decipher an address topography of a memory array in order to attack the memory to retrieve sensitive data. In some examples, the first and second scramble key(s) may be common. In some examples, the first and second scramble key(s) may be regenerated (e.g., updated or changed) during or after every reset or power cycle of the memory. In some examples, the first and second scramble key(s) may be regenerated in response to a command received from a memory controller.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which show by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

FIG. 1 is a block diagram of a semiconductor device 100 according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/ write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

In some examples, the address decoder 104 may include an address scrambler 105 configured to scramble an address received via the C/A bus based on a first (one or more) scramble key(s) provided by a random number generator 130 to provide the row address XADD as a scrambled row address. The address scrambler 105 may be configured to perform logical bitwise operations using the received row address and the first scramble key(s) to generate the scrambled row address XADD. The random number generator 130 may randomly generate the first scramble key(s) using random number generator logic or circuitry. The random number generator 130 may include a linear feedback shift register and may use a seed value to initiate the random generation of the scramble key(s). In some examples, the random number generator 130 may generate different scramble keys for each bank BANK-07 of the memory cell array 118. The scrambled row address XADD may improve security of the semiconductor device 100 by making it more difficult to decipher an address topography of a memory array in order to attack the memory to retrieve sensitive data.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. The device 100 may be periodically placed in a refresh mode. Thus, refresh operations may be performed periodically each time the memory device is in the refresh mode. In some embodiments, the refresh mode command may be externally issued to the memory device 100. In some embodiments, the refresh mode command may be periodically generated by a component of the device. In some embodiments, when an external signal indicates a refresh mode entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the refresh mode. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD, the row decoder 108 may perform a targeted refresh or auto-refresh operation. The automatic refresh addresses may be from a sequence of addresses which are provided based on activations of the refresh signal AREF. The refresh control circuit 116 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

In some examples, during auto-refresh operations, rather than refreshing addresses of the memory cell array 118 in sequence, the refresh control circuit 116 may include an address scrambler configured to scramble the sequential automatic refresh address based on a second (one or more) scramble key(s) provided by the random number generator 130 to provide the refresh address RXADD. The address scrambler of the refresh control circuit 116 may be configured to perform logical bitwise operations using the sequential automatic refresh address and the second scramble key(s) to generate the scrambled refresh address RXADD during auto-refresh operations. The random number generator 130 may randomly generate the second scramble key(s) using random number generator logic or circuitry. In some examples, the random number generator 130 may generate different first and second scramble keys for generation of the row address XADD by the address scrambler 105 and the refresh address RXADD by the refresh control circuit 116 during an auto-refresh operation. The scrambled refresh address RXADD may provide an added layer of security by making it even more difficult to decipher an address topography of a memory array in order to attack the memory to retrieve sensitive data. In some examples, the first and second scramble key(s) may be common.

In some examples, the random number generator 130 may be configured to regenerate (e.g., update or change) the first and second scramble key(s) during or after every reset or power cycle of the memory. In some examples, the random number generator 130 may be configured to regenerate the first and second scramble key(s) in response to a command received from a memory controller.

As used herein, an activation of a signal may refer to any portion of a signal's waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses. Thus, because the targeted refresh is intended to protect specific victim rows based on the aggressor row HitXADD, the refresh control circuit 116 may not scramble the refresh addresses RXADD for the targeted refresh operations.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similar victim addresses may be determined based on which wordlines are expected to be effected by aggressors, rather than a definitive determination of which wordlines are undergoing an increased rate of data decay.

The refresh address RXADD may be provided with a timing based on a timing of the refresh signal AREF. During the periodic refresh operations of a refresh mode, the refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh control circuit 116 may determine whether to provide a targeted refresh address, not provide an address during that time slot, or provide an auto-refresh address instead during the time slot.

The refresh control circuit 116 may use multiple methods to determine the timing of targeted refresh operations. The refresh control circuit 116 may have periodic targeted refresh operations during a refresh mode, where the refresh control circuit 116 performs auto-refresh operations and targeted refresh operations (e.g., by providing a targeted refresh address as the refresh address RXADD) based on a periodic schedule. For example, after entering a refresh mode, the refresh control circuit 116 may perform a certain number of auto-refresh operations, and then perform (e.g., steal) a certain number of targeted refresh operations.

The refresh control circuit 116 may also perform requested targeted refresh operations or panic targeted refresh operations, which may be based on access patterns to the bank associated with the refresh control circuit 116. The device 100 may receive commands which are refresh management commands (e.g., may receive request management commands at the command/address terminal C/A). The command decoder circuit 106 may provide a refresh management signal to the refresh control circuit 116, and responsive to an activation of the RFM signal, the refresh control circuit 116 may indicate that a panic targeted refresh operation should be performed.

These panic targeted refresh operations may happen outside of a refresh period. For example, a high rate of accesses to the bank may indicate that an attack is taking place, and the refresh control circuit 116 may count the access commands and perform a panic targeted refresh operation once the count exceeds a threshold. As the number of panic targeted refresh operations increases, the refresh control circuit 116 may decrease a number of periodic targeted refresh operations during the next refresh mode. It should be understood that the process of refreshing wordlines during a periodic and panic targeted refresh operation may generally be the same, and the difference may generally be in the timing of when the refreshes are performed.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
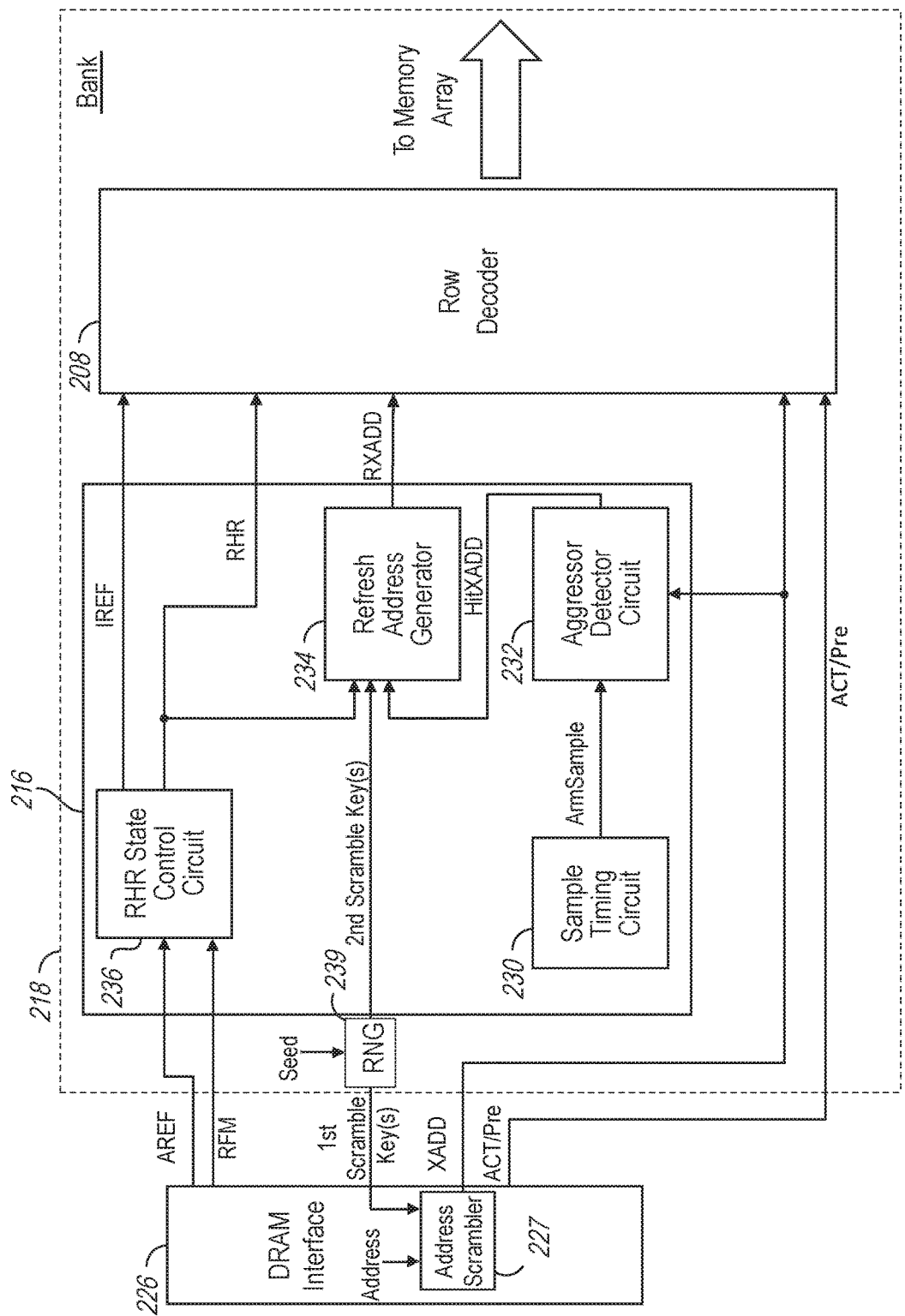
FIG. 2 is a block diagram of a refresh control circuit according to an embodiment of the present disclosure.

FIG. 2 is a block diagram of a refresh control circuit 200 according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components (e.g., the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generator 234. The DRAM interface 226 may provide one or more control signals, such as a refresh signal AREF, activation and pre-charge signals ACT/Pre, and a row address XADD. The refresh control circuit 216 provides refresh address RXADD with timing based on the refresh signal AREF when the bank associated with the refresh control circuit 216 is in the refresh mode. The refresh control circuit may also provide the refresh address RXADD (and other signals) to indicate a panic targeted refresh based on a pattern of accesses to the bank of the memory.

In the example embodiment of FIG. 2, the aggressor detector circuit 232 may sample the current row address XADD responsive to an activation of an optional sampling signal ArmSample provided by the sample timing circuit 230. The aggressor detector circuit 232 may be coupled to all of the row addresses XADD sent along the row address bus, but may only receive (e.g., process, pay attention to) the current value of the row address XADD when there is an activation of the sampling signal ArmSample. In other example embodiments sampling may not be used.

The received row addresses (either the sampled addresses or all addresses) may be stored in the aggressor circuit 232 and/or compared to previously stored addresses. The aggressor detector circuit 232 may provide a match address HitXADD based on a current row address XADD and/or previously stored row addresses. The RHR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto-refresh should occur.

Responsive to an activation of RHR or IREF, the refresh address generator 234 may provide a refresh address RXADD, which may be an auto-refresh address or may be one or more victim addresses corresponding to victim rows of the aggressor row corresponding to the match address HitXADD. The RHR state control circuit 236 may provide a set of activations of RHR and IREF responsive to the refresh signal AREF. The row decoder 208 may perform a refresh operation responsive to the refresh address RXADD and the row hammer refresh signal RHR. The row decoder 208 may perform an auto-refresh operation based on the refresh address RXADD and the internal refresh signal IREF.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, the refresh signal AREF, and access signals such as an activation signal ACT and a pre-charge signal Pre. Although not shown in FIG. 2, the DRAM interface 226 may also provide a bank address BADD, which may indicate which bank the accessed row address XADD is located in. The bank address BADD may activate a particular refresh control circuit 216 associated with the bank indicated by the bank address BADD.

The DRAM interface 226 may also put the refresh control circuit 216 into a refresh mode by providing activations of the refresh signal AREF. The refresh signal AREF may be a periodic signal provided during a refresh mode which may indicate a timing for refresh operations. The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

In some examples, the DRAM interface 226 may include an address scrambler 227 configured to scramble an address received via a command and address bus (e.g., via the C/A bus of FIG. 1) based on a first (one or more) scramble key(s) provided by a random number generator 239 to provide the row address XADD. The address scrambler 227 may be configured to perform logical bitwise operations using the received address and the first scramble key(s) to generate the scrambled row address XADD. The random number generator 239 may randomly generate the first scramble key(s) using random number generator logic or circuitry. The random number generator 239 may include a linear feedback shift register and may use a seed value to initiate the random generation of the first scramble key(s). In some examples, the random number generator 239 may generate different first scramble key(s) for each bank of a memory die. The scrambled row address XADD may improve security of the memory device by making it more difficult to decipher an address topography of a memory array in order to attack the memory to retrieve sensitive data.

In the example embodiment of FIG. 2, the refresh control circuit 216 uses sampling to monitor a portion of the row addresses XADD provided along the row address bus. Accordingly, instead of responding to every row address, the refresh control circuit 216 may sample the current value of the row address XADD on the row address bus, and may determine which addresses are aggressors based on the sampled row addresses. The timing of sampling by the refresh control circuit 216 may be controlled by the sample timing circuit 230 which provides the sampling signal ArmSample. The sample timing circuit 230 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level. The activations of the signal ArmSample may be provided with periodic timing, random timing, semi-random timing, pseudo-random timing, or combinations thereof. In some embodiments, the timing of the signal ArmSample may be based, in part, on one or more other signals, such as access signals ACT/Pre. In other embodiments, sampling may not be used, and the aggressor detector circuit 232 may receive every value of the row address XADD along the row address bus. In such embodiments, the sample timing circuit 230 and the sampling signal ArmSample may be omitted.

The aggressor detector circuit 232 may receive the row address XADD from the DRAM interface 226 and the signal ArmSample from the sample timing circuit 230. The row address XADD on the row address bus may change as the DRAM interface 226 directs access operations (e.g., read and write operations) to different rows of the memory cell array (e.g., memory cell array 118 of FIG. 1). Each time the aggressor detector circuit 232 receives an activation (e.g., a pulse) of the signal ArmSample, the aggressor detector circuit 232 may sample the current value of XADD.

The aggressor detector circuit 232 may determine aggressor addresses based on one or more of the sampled row addresses, and then may provide the determined aggressor address as the match address HitXADD. The aggressor detector circuit 232 may include a data storage unit (e.g., a number of registers), which may be used to store sampled row addresses. In some example embodiments, when the aggressor detector circuit 232 samples a new value of the row address XADD (e.g., responsive to an activation of ArmSample) it may compare the sampled row address to the addresses stored in the data storage unit. If there is a match between the sampled address and one of the stored addresses, the aggressor detector circuit 232 may provide a match signal Match. In some example embodiments, the match address HitXADD may be one of the addresses stored in the aggressor detector circuit 232 which has been matched by the sampled address XADD the most frequently. For example, the aggressor detector circuit 232 may count a number of times that each address XADD is received, and provide the address which has been received the most times as the match address HitXADD.

The memory device may carry out a sequence of refresh operations in order to periodically refresh the rows of the memory device as part of a refresh mode. The RHR state control circuit 236 may determine if a given refresh operation is an auto-refresh operation or a targeted refresh operation. The RHR signal may be generated in order to indicate that the device should refresh a particular targeted row (e.g., a victim row) instead of an address from the sequence of auto-refresh addresses. The RHR state control circuit 236 may also provide an internal refresh signal IREF, which may indicate that an auto-refresh operation should take place. In some embodiments, the signals RHR and IREF may be generated such that they are not active at the same time (e.g., are not both at a high logic level at the same time). In some embodiments, IREF may be activated for every refresh operation, and an auto-refresh operation may be performed unless RHR is also active, in which case a targeted refresh operation is performed instead. The RHR state control circuit may perform a sequence of auto-refresh operations and targeted refresh operation responsive to one or more activations of the refresh signal AREF.

In some embodiments, the refresh control circuit 216 may perform multiple refresh operations responsive to each activation of the refresh signal AREF. For example, each time the refresh signal AREF is received, the refresh control circuit 216 may perform K different refresh operations, by providing K different refresh addresses RXADD. Each refresh operation may be referred to as a 'pump'. Each of the K different refresh operations may be an auto-refresh operation or a targeted refresh operation. In some embodiments, the number of targeted and auto-refresh operations may be constant in each group of pumps responsive to an activation of the refresh signal AREF. In some embodiments it may vary.

During auto-refresh operations, the refresh address generator 234 may provide an automatic refresh address from a sequence of auto-refresh addresses. However, in some examples, the refresh address generator 234 may include an address scrambler configured to scramble the sequential automatic refresh address based on a second (one or more) scramble key(s) provided by the random number generator 239 to provide the scrambled refresh address RXADD. The address scrambler of the refresh address generator 234 may be configured to perform logical bitwise operations using the sequential automatic refresh address and the second scramble key(s) to generate the scrambled refresh address RXADD during auto-refresh operations. The random number generator 239 may randomly generate the second scramble key(s) using random number generator logic or circuitry. In some examples, the random number generator 239 may generate different first and second scramble keys for generation of the row address XADD by the address scrambler 227 and the refresh address RXADD by the refresh address generator 234 during an auto-refresh operation. The scrambled refresh address RXADD may provide an added layer of security by making it even more difficult to decipher an address topography of a memory array in order to attack the memory to retrieve sensitive data. In some examples, the first and second scramble key(s) may be common.

In some examples, the random number generator 239 may be configured to regenerate (e.g., update or change) the first and second scramble key(s) during or after every reset or power cycle of the memory. In some examples, the random number generator 239 may be configured to regenerate the first and second scramble key(s) in response to a command received from a memory controller.

During a targeted refresh operation, the refresh address generator 234 may receive the row hammer refresh signal RHR and the match address HitXADD. The match address HitXADD may represent an aggressor row. The refresh address generator 234 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed. Because the targeted refresh is intended to protect specific victim rows based on the aggressor row HitXADD, the refresh address generator 234 may not scramble the refresh addresses RXADD for the targeted refresh operations.

The refresh address generator 234 may determine the value of the refresh address RXADD based on the row hammer refresh signal RHR. In some embodiments, when the signal RHR is not active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows (e.g., HitXADD+/−1) more frequently than victim rows which are further away from the aggressor address (e.g., HitXADD+/−2).

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD.

The refresh control circuit 216 receives a refresh management signal RFM, which may be provided to a memory device (e.g., device 100 of FIG. 1) based on access operations performed on the bank associated with the refresh control circuit 216. Responsive to the signal RFM, the RHR state control circuit 236 may perform a targeted refresh operation even if the device is not otherwise performing refresh operations.

Accordingly, the RHR state control circuit 236 may indicate that targeted refresh operations should be performed as part of a periodic sequence, and may also indicate that targeted refresh operations should be performed responsive to an activation of the signal RFM. Targeted refresh operations performed as part of a periodic sequence of refresh operations may generally be referred to as 'periodic targeted refresh operations' in order to distinguish them from targeted refresh operations performed responsive to the signal RFM, which may generally be referred to as 'requested targeted refresh operations' or 'panic targeted refresh operations'. It should be understood that the method of actually performing the periodic targeted refresh operation and the requested targeted refresh operation may generally be the same (e.g., refreshing victim wordlines based on the match address HitXADD), and the different terminology is meant to distinguish the cause of a particular targeted refresh operation.

A memory controller may monitor the access commands which are being provided to a given bank of the memory. The memory controller may include a refresh management (RFM) logic circuit which may include a count value. The count value stored in the RFM logic circuit may be a rolling accumulated ACT (RAA) count. The controller may include a separate count value RAA for each bank of the memory device and may separately compare each count value RAA to a threshold to determine if the signal RFM (or a refresh management command) should be provided to the bank associated with that count value RAA. The RAA count may be compared to a threshold which is an RAA initial management threshold (RAAIMT). The value of the threshold RAAIMT may be a configurable value.

The signal RFM may be provided to the memory device based on the comparison of the count RAA to the threshold RAAIMT. For example, in an embodiment where the count RAA is increased responsive to each activation of ACT, the controller may determine if the count RAA is greater than the threshold RAAIMT. In such an embodiment, if the count RAA is greater than RAAIMT, then the signal RFM is provided to the refresh control circuit 216. When the signal RFM is provided, the value of the count RAA may be changed. For example, if the count RAA is increased (e.g., incremented) responsive to ACT, then responsive to the signal RFM being provided, the count RAA may be decreased. In some embodiments, the count RAA may be decreased by the value of the threshold RAAINT. In some embodiments, the count value RAA may have a minimum value (e.g., 0) which the count value RAA cannot be decreased below even if the reduction of RAA by the value of RAAINT would normally be below that minimum value.

The RHR state control circuit 236 may receive the refresh signal AREF and the signal RFM and provide the row hammer refresh signal RHR and internal refresh signal IREF. The refresh signal AREF may be periodically generated and may be used to control the timing of refresh operations. The signals RHR and IREF may be used to control whether the memory performs a targeted refresh operation or an auto-refresh operation, respectively. For example, responsive to each activation of the signal AREF, the RHR state control circuit 236 may provide a number of activations of the internal refresh signal IREF. Responsive to each activation of IREF (as long as the signal RHR is not active) an auto-refresh operation may be performed. The RHR state control circuit 236 may perform periodic targeted refresh operations by providing a number of activations of the signal RHR after counting a certain number of the activations of IREF. In other words, with timing based on AREF, the RHR state control circuit 236 may indicate that the memory should provide a first number of auto-refresh operations, then a second number of auto-refresh operations, then the first number of auto-refresh operations again, etc. For example, the RHR state control circuit 236 may indicate that 8 auto-refresh operations should be performed (e.g., by providing IREF eight times) and then may indicate that 4 targeted refresh operations should be performed (e.g., by providing IREF along with RHR four times), and then repeating that cycle for as long as the memory device is in a refresh mode. Other numbers of auto-refresh and targeted refresh operations may be used in other examples. Accordingly, a normal operation of the memory may include a period of time over which the memory performs some number of access operations (e.g., due to external commands) and then a period of time in a refresh mode (e.g., when AREF is being provided) where a sequence of auto- and targeted-refresh operations are being performed.

Figure 3:
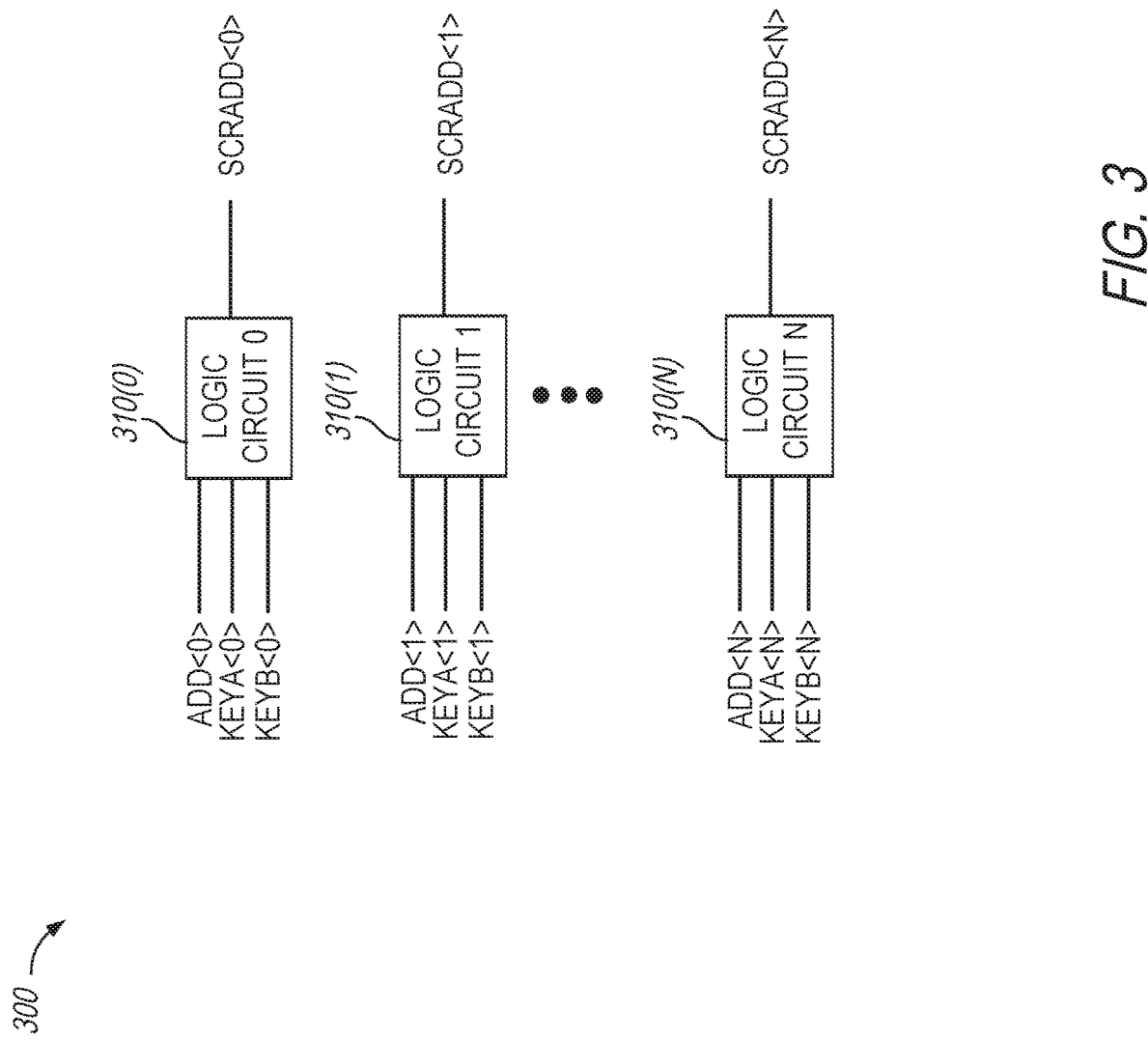
FIG. 3 is a block diagram of an address scrambler according to an embodiment of the disclosure.

FIG. 3 is a block diagram of an address scrambler 300 according to an embodiment of the disclosure. The address scrambler 300 may, in some embodiments, be included in the address scrambler 105 and/or the refresh control circuit 116 of FIG. 1 and/or the address scrambler 227 or the refresh address generator 234 of FIG. 2. The address scrambler 300 is configured to scramble an address ADD<N:0> using a first scramble key KEYA<X:0> and a second scramble key KEYB<N:0> to provide a scrambled address SCRADD<N:0>. The scrambled address SCRADD<N:0> may apply to the XADD or the RXADD of FIGS. 1 and 2.

The address scrambler 300 may include logic circuits 0-N 310(0)-(N) each configured to receive a respective bit of the address ADD<N:0>, a respective bit of the first scramble key KEYA<N:0>, and a respective bit of the second scramble key KEYB<N:0>. Each of the logic circuits 0-N 310(0)-(N) may be further configured to provide a respective bit of the scrambled address SCRADD<N:0> based on the respective bit of the address ADD<N:0>, the respective bit of the first scramble key KEYA<N:0>, and the respective bit of the second scramble key KEYB<N:0>. In some examples, each of the logic circuits 0-N 310(0)-(N) may be configured to provide a respective bit of the scrambled address SCRADD<N:0> based on a logical bitwise comparison between the respective bit of the address ADD<N:0>, the respective bit of the first scramble key KEYA<N:0>, and the respective bit of the second scramble key KEYB<N:0>. In some examples, the logical bitwise comparison is an exclusive OR comparison.

It is appreciated that the address scrambler 300 is exemplary, and other logic circuits could be implemented in the address scramblers described herein without departing from the scope of the disclosure.

Figure 4:
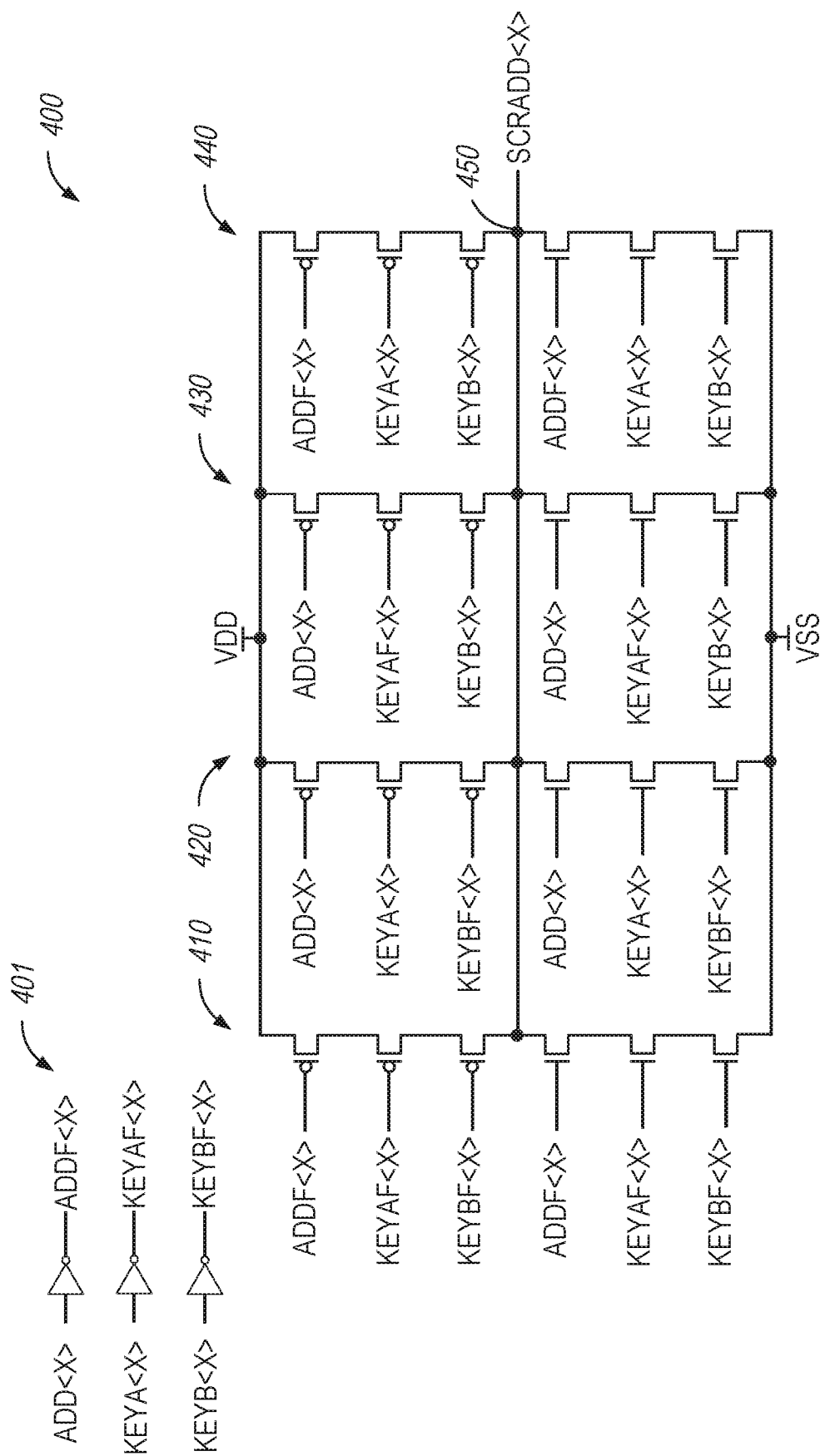
FIG. 4 is a schematic diagram of an address scrambler according to an embodiment of the disclosure.

FIG. 4 is a schematic diagram of an address scrambler 400 according to an embodiment of the disclosure. The address scrambler 400 may, in some embodiments, be included in the address scrambler 105 and/or the refresh control circuit 116 of FIG. 1, the address scrambler 227 or the refresh address generator 234 of FIG. 2, each of the logic circuits 0-N 310(0)-(N) of the address scrambler 300 of FIG. 3, or any combination thereof. The address scrambler 400 is configured to scramble an address bit ADD<X> using a first scramble key bit KEYA<X> and a second scramble key bit KEYB<X> to provide a scrambled address bit SCRADD<X> at an output node 450. The address scrambler 400 includes inverter circuits 401 configured to invert each of the ADD<X>, KEYA<X>, and KEYB<X> bits to provide inverted ADDF<X>, KEYAF<X>, and KEYBF<X> bits.

The address scrambler 400 may include a first column 410, a second column 420, a third column 430, and a fourth column 440. Each of the first column 410, the second column 420, the third column 430, and the fourth column 440 includes a respective set of three serially-coupled p-type transistors coupled between a first voltage source VDD and the output node 450 and a respective set of three serially-coupled n-type transistors coupled between a second voltage source VSS and the output node 450.

The three serially-coupled p-type transistors and the three serially-coupled n-type transistors of the first column 410 may be controlled by the ADDF<X> bit, the KEYAF<X> bit, and the KEYBF<X> bit. Thus, if each of the ADDF<X> bit, the KEYAF<X> bit, and the KEYBF<X> bit have a low logical value, then the three serially-coupled p-type transistors of the first column 410 are activated to couple the output node 450 to the VDD voltage source, which may transition the SCRADD<X> bit to a high logical value. In addition, if each of the ADDF<X> bit, the KEYAF<X> bit, and the KEYBF<X> bit have a high logical value, then the three serially-coupled n-type transistors of the first column 410 are activated to couple the output node 450 to the VSS voltage source, which may transition the SCRADD<X> bit to a low logical value. Otherwise, the first column 410 may not affect the voltage at the output node 450.

The three serially-coupled p-type transistors and the three serially-coupled n-type transistors of the second column 420 may be controlled by the ADD<X> bit, the KEYA<X> bit, and the KEYBF<X> bit. Thus, if each of the ADD<X> bit, the KEYA<X> bit, and the KEYBF<X> bit have a low logical value, then the three serially-coupled p-type transistors of the second column 420 are activated to couple the output node 450 to the VDD voltage source, which may transition the SCRADD<X> bit to a high logical value. In addition, if each of the ADD<X> bit, the KEYA<X> bit, and the KEYBF<X> bit have a high logical value, then the three serially-coupled n-type transistors of the second column 420 are activated to couple the output node 450 to the VSS voltage source, which may transition the SCRADD<X> bit to a low logical value. Otherwise, the second column 420 may not affect the voltage at the output node 450.

The three serially-coupled p-type transistors and the three serially-coupled n-type transistors of the third column 430 may be controlled by the ADD<X> bit, the KEYAF<X> bit, and the KEYB<X> bit. Thus, if each of the ADD<X> bit, the KEYAF<X> bit, and the KEYB<X> bit have a low logical value, then the three serially-coupled p-type transistors of the third column 430 are activated to couple the output node 450 to the VDD voltage source, which may transition the SCRADD<X> bit to a high logical value. In addition, if each of the ADD<X> bit, the KEYAF<X> bit, and the KEYB<X> bit have a high logical value, then the three serially-coupled n-type transistors of the third column 430 are activated to couple the output node 450 to the VSS voltage source, which may transition the SCRADD<X> bit to a low logical value. Otherwise, the third column 430 may not affect the voltage at the output node 450.

The three serially-coupled p-type transistors and the three serially-coupled n-type transistors of the fourth column 440 may be controlled by the ADDF<X> bit, the KEYA<X> bit, and the KEYB<X> bit. Thus, if each of the ADDF<X> bit, the KEYA<X> bit, and the KEYB<X> bit have a low logical value, then the three serially-coupled p-type transistors of the fourth column 440 are activated to couple the output node 450 to the VDD voltage source, which may transition the SCRADD<X> bit to a high logical value. In addition, if each of the ADDF<X> bit, the KEYA<X> bit, and the KEYB<X> bit have a high logical value, then the three serially-coupled n-type transistors of the fourth column 440 are activated to couple the output node 450 to the VSS voltage source, which may transition the SCRADD<X> bit to a low logical value. Otherwise, the fourth column 440 may not affect the voltage at the output node 450.

Accordingly, the combination of the first column 410, the second column 420, the third column 430, and the fourth column 440 may be configured to apply XOR logic between the ADD<X>, KEYA<X>, and KEYB<X> bits to provide the SCRADD<X> bit. It is appreciated that the address scrambler 400 is exemplary, and other logic circuits could be implemented in the address scramblers described herein without departing from the scope of the disclosure.

Figure 5:
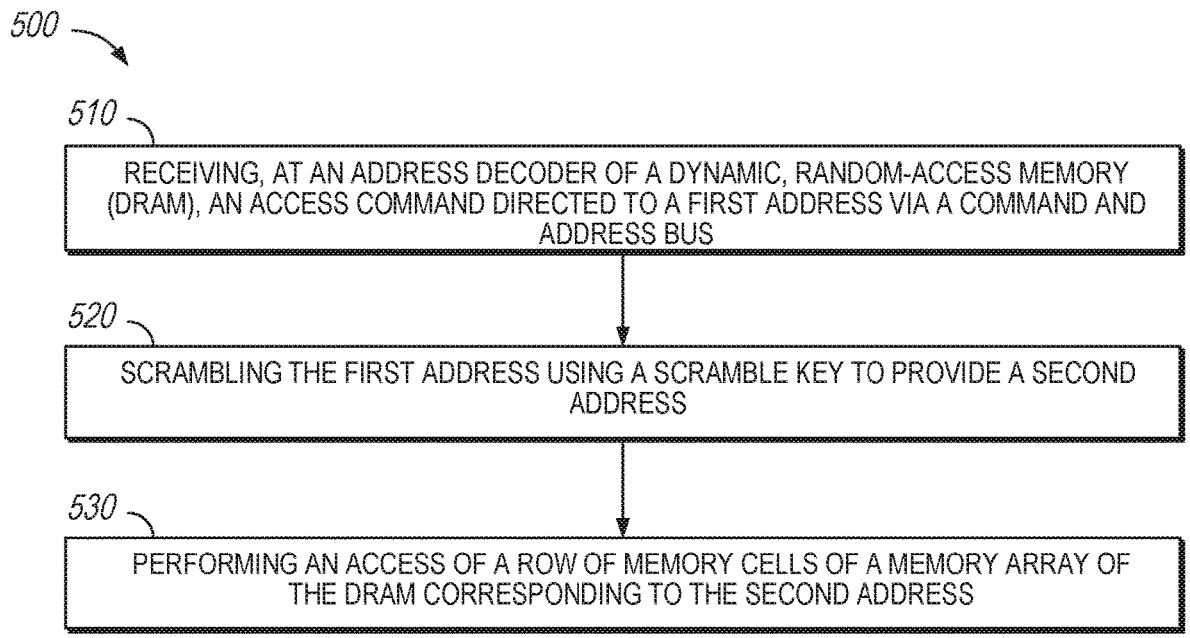
FIG. 5 is a block diagram of a method to scramble addresses in a volatile memory according to an embodiment of the disclosure.

FIG. 5 is a block diagram of a method 500 to scramble addresses in a volatile memory according to an embodiment of the disclosure. The method 500 may, in some embodiments, be implemented by one or more of the components discussed in FIGS. 1-4. While a certain sequence of operations is discussed with respect to the method 500, it should be understood that certain operations may be performed in a different order, repeated, and/or omitted in other embodiments. Certain steps may happen simultaneous to each other in some embodiments.

The method 500 may include receiving, at an address decoder of a dynamic, random-access memory (DRAM), an access command directed to a first address via a command and address bus, at 510. The address decoder may include the address decoder 104 of FIG. 1 and/or may be implemented in the DRAM interface address scrambler 227 of FIG. 2. The DRAM may include the semiconductor device 100 of FIG. 1. In some examples, the method 500 may further include generating the scramble key using a random number generation algorithm. For example, the scramble key may be generated using a random number generator, such as the random number generator 130 of FIG. 1 or the random number generator 239 of FIG. 2.

The method 500 may further include scrambling the first address using a scramble key to provide a second address, at 520. The scramble may be performed using the address scrambler 105 and/or the address scrambler of the refresh logic circuit 116 of FIG. 1, the address scrambler 227 or the address scrambler of the refresh address generator 234 of FIG. 2, the address scrambler 300 of FIG. 3, and/or the address scrambler 400 of FIG. 4. The scramble key may include the first or second scramble key(s) of FIGS. 1 and/or 2, the first or second scramble keys KEYA<N:0> or KEYB<N:0> of FIG. 3, or may be included in the scramble key KEYA<X> or KEYB<X> of FIG. 4. In some examples, the method 500 may further include providing the second address based on a bitwise logical comparison between individual bits of the first address and individual bits of the scramble key. In some examples, the method 500 may further include providing the second address based on a bitwise logical comparison between individual bits of the first address and individual bits of the scramble key, and individual bits of a second scramble key. In some examples, the second scramble key is different than the first scramble key.

The method 500 may further include performing an access of a row of memory cells of a memory array of the DRAM corresponding to the second address, at 530. In some examples, the method 500 may further include changing the scramble key in response to a reset or a power-up. In some examples, the method 500 may further include changing the scramble key in response to receipt of a command from a memory controller.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
  a memory array comprising a first row of volatile memory cells corresponding to a first address and a second row of volatile memory cells corresponding to a second address; and
  an address decoder configured to receive an access command directed to the first address via a command and address bus and to scramble the first address using a scramble key to provide the second address, wherein an access of the second row of memory cells corresponding to the second address is performed in response to the access command, and wherein the second address is provided by applying a logical bitwise comparison between a respective bit of the first address and a respective bit of the scramble key to provide a respective bit of the second address.

2. The apparatus of claim 1, wherein the address decoder comprises an address scrambler configured to scramble the first address using the scramble key to provide the second address.

3. The apparatus of claim 1, further comprising a plurality of logic circuits each configured to apply the logical bitwise comparison between the respective bit of the first address, the respective bit of the scramble key, and a respective bit of a second scramble key to provide the bit of the second address.

4. The apparatus of claim 1, further comprising a random number generator configured to generate the scramble key using a random number generation algorithm.

5. The apparatus of claim 4, wherein the random number generator configured to change the scramble key in response to a reset or a power-up.

6. The apparatus of claim 4, wherein the random number generator configured to change the scramble key in response to receipt of a command from a memory controller.

7. An apparatus, comprising:
a memory array comprising a first row of volatile memory cells corresponding to a first address and a second row of volatile memory cells corresponding to a second address;
an address decoder configured to receive an access command directed to the first address via a command and address bus and to scramble the first address using a scramble key to provide the second address, wherein an access of the second row of memory cells corresponding to the second address is performed in response to the access command; and
a refresh control circuit configured to scramble a sequential refresh row using a second scramble key to provide a scrambled refresh row, wherein a refresh operation on a row of volatile memory cells of the memory array is performed based on the scrambled refresh row.

8. The apparatus of claim 7, wherein the second scramble key is different than the first scramble key.

9. The apparatus of claim 1, wherein the memory array is a dynamic, random-access memory array.

10. An apparatus comprising:
a memory array comprising a plurality of rows of volatile memory cells; and
a refresh control circuit configured to scramble a first refresh address using a scramble key to provide a first scrambled refresh address corresponding to a first row of the plurality of rows of volatile memory cells for use in a first automatic refresh operation and to scramble a second refresh address using the scramble key to provide a second scrambled refresh address corresponding to a second row of the plurality of rows of volatile memory cells for use in a second automatic refresh operation following the first refresh operation, wherein the first address is sequential with the second address and the first scrambled address is not sequential with the second scrambled address.

11. The apparatus of claim 10, further comprising an address decoder configured to scramble an access address corresponding to a received address command using a second scramble key to provide a scrambled access address, wherein an access of a row of the plurality of memory cells corresponding to the scrambled access address is performed in response to the access command.

12. The apparatus of claim 11, wherein the second scramble key is different than the first scramble key.

13. The apparatus of claim 10, further comprising a random number generator configured to generate the scramble key using a random number generation algorithm.

14. The apparatus of claim 13, wherein the random number generator configured to change the scramble key in response to a reset or a power-up.

15. The apparatus of claim 13, wherein the random number generator configured to change the scramble key in response to receipt of a command from a memory controller.

16. A method comprising:
receiving, at an address decoder of a dynamic, random-access memory (DRAM), an access command directed to a first address via a command and address bus;
scrambling the first address using a scramble key to provide a second address;
providing the second address based on a bitwise logical comparison between individual bits of the first address and individual bits of the scramble key, and
performing an access of a row of memory cells of a memory array of the DRAM corresponding to the second address.

17. The method of claim 16, further comprising providing the second address based on a bitwise logical comparison between individual bits of the first address and individual bits of the scramble key, and individual bits of a second scramble key.

18. The apparatus of claim 17, wherein the second scramble key is different than the first scramble key.

19. The method of claim 16, further comprising generating the scramble key using a random number generation algorithm.

20. The method of claim 19, further comprising changing the scramble key in response to a reset or a power-up.

21. The method of claim 19, further comprising changing the scramble key in response to receipt of a command from a memory controller.

22. A method comprising:
scrambling, at an address decoder a dynamic, random-access memory (DRAM), a first address associated with an access command using a first scramble key to provide a second address;
performing an access of a first row of memory cells of a memory array of the DRAM corresponding to the second address;
scrambling, at the refresh control circuit of the DRAM, the first address using a second scramble key to provide a third address; and
performing a refresh of a second row of memory cells of the memory array corresponding to the third address.

23. The method of claim 22, further comprising wherein the first scramble key is different than the second scramble key.

24. The method of claim 22, further comprising performing, at the address decoder, a bitwise logical comparison between individual bits of the first address and individual bits of the first scramble key to scramble the first address to provide the second address.

25. The method of claim 22, further comprising performing, at the address decoder, a bitwise logical comparison between individual bits of the first address, individual bits of the first scramble key, and individual bits of a third scramble key to scramble the first address to provide the second address.

26. The method of claim 25, further comprising performing, at the refresh control circuit, a bitwise logical comparison between individual bits of the first address, individual bits of the second scramble key, and individual bits of a fourth scramble key to scramble the first address to provide the third address.

27. The method of claim 22, further comprising changing the first scramble key, the second scramble key, or a combination thereof in response to a reset or a power-up.

28. The method of claim 22, further comprising changing the first scramble key, the second scramble key, or a combination thereof in response to receipt of a command from a memory controller.

* * * * *